(12) United States Patent
Sareen et al.

(10) Patent No.: US 7,423,466 B2
(45) Date of Patent: Sep. 9, 2008

(54) APPARATUS FOR ENABLING DUTY CYCLE LOCKING AT THE RISING/FALLING EDGE OF THE CLOCK

(75) Inventors: Puneet Sareen, Delhi (IN); Sashi P. Singh, Noida (IN)

(73) Assignee: STMicroelectronics Pvt. Ltd., Noida (IN)

( * ) Notice: Subject to any disclaimer, the term of this patent is extended or adjusted under 35 U.S.C. 154(b) by 0 days.

(21) Appl. No.: 11/413,630

(22) Filed: Apr. 28, 2006

(65) Prior Publication Data

US 2006/0250169 A1 Nov. 9, 2006

(30) Foreign Application Priority Data

Apr. 29, 2005 (IN) .................. 1068/DEL/2005

(51) Int. Cl.
*H03K 3/017* (2006.01)
(52) U.S. Cl. .................. 327/175; 327/176; 327/158
(58) Field of Classification Search .................. 327/175, 327/176, 158
See application file for complete search history.

(56) References Cited

U.S. PATENT DOCUMENTS

| | | | | |
|---|---|---|---|---|
| 5,278,520 A | * | 1/1994 | Parker et al. ................. | 331/1 A |
| 5,371,764 A | * | 12/1994 | Gillingham et al. ......... | 375/354 |
| 5,446,867 A | * | 8/1995 | Young et al. ................ | 713/503 |
| 5,675,273 A | * | 10/1997 | Masleid ...................... | 327/156 |
| 6,182,236 B1 | * | 1/2001 | Culley et al. ................ | 713/503 |
| 6,448,828 B2 | * | 9/2002 | Stark et al. .................. | 327/175 |
| 6,483,361 B1 | * | 11/2002 | Chiu .......................... | 327/159 |
| 6,831,493 B2 | * | 12/2004 | Ma ............................ | 327/175 |
| 7,042,971 B1 | * | 5/2006 | Flanagan et al. ............ | 375/376 |
| 7,116,143 B2 | * | 10/2006 | Deivasigamani et al. .... | 327/149 |
| 7,259,604 B2 | * | 8/2007 | Gomm ........................ | 327/175 |
| 2003/0218486 A1 | | 11/2003 | Kwak | |

* cited by examiner

*Primary Examiner*—Kenneth B. Wells
*Assistant Examiner*—An T. Luu
(74) *Attorney, Agent, or Firm*—Gardere Wynne Sewell LLP

(57) ABSTRACT

An apparatus for enabling duty cycle locking at the rising/falling edge of the clock includes a counter that receives a gated input clock. A lock detector receives an input clock for generating control signals. An address decoder is connected to the counter for generating a set of selection signals. A first multiplexer includes select lines connected to receive the selection signals. A plurality of delay chains provide multiple output taps with a first delay chain connected to the first multiplexer. A second multiplexer is connected to one of the plurality of delay chains with its select lines being hard wired. A latch is connected to the output of the first multiplexer and the second multiplexer for providing the output.

19 Claims, 5 Drawing Sheets

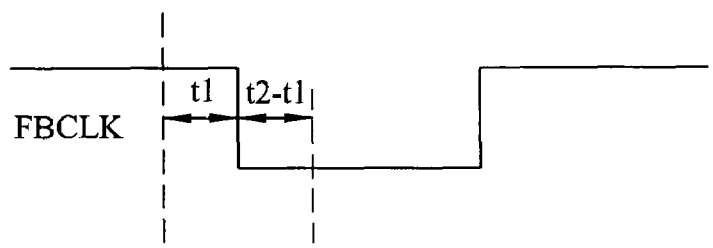
FIG. 5.1
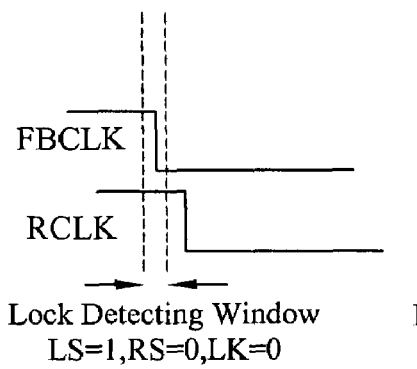
Lock Detecting Window
LS=1,RS=0,LK=0
FIG. 5.2
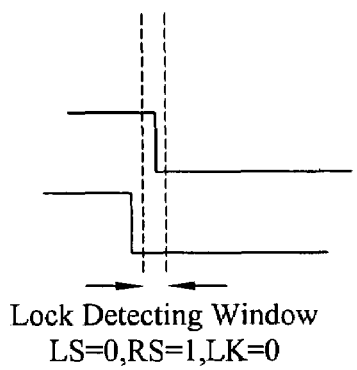
Lock Detecting Window
LS=0,RS=1,LK=0
FIG. 5.3
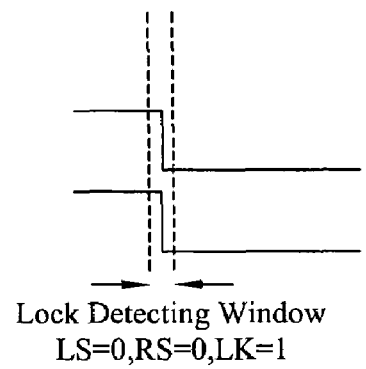
Lock Detecting Window
LS=0,RS=0,LK=1
FIG. 5.4

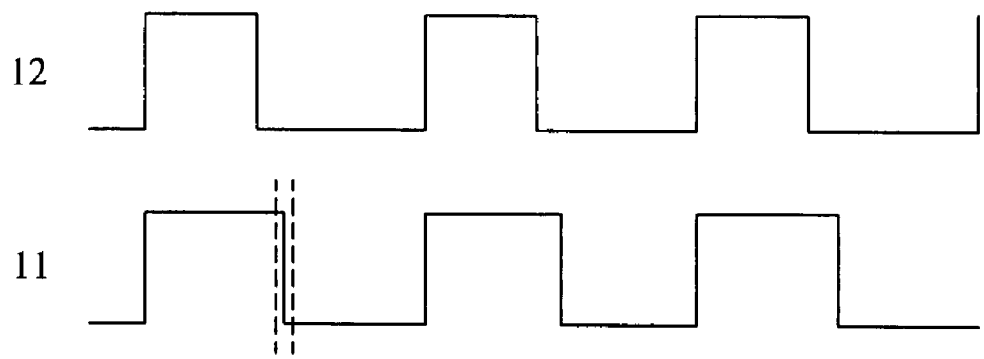
FIG. 6.1
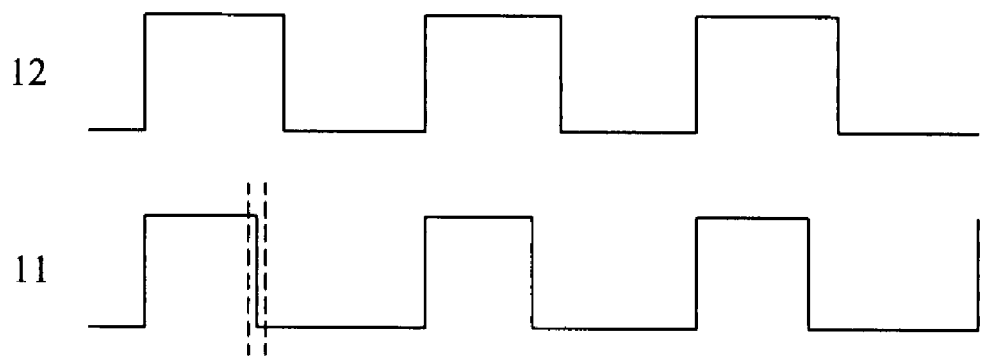
FIG. 6.2
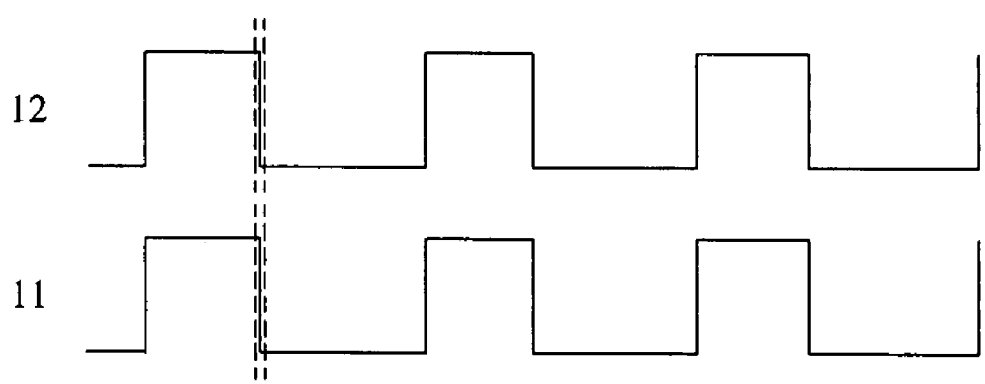
FIG. 6.3

APPARATUS FOR ENABLING DUTY CYCLE LOCKING AT THE RISING/FALLING EDGE OF THE CLOCK

PRIORITY CLAIM

The present application claims priority from Indian Patent Application No. 1068/Del/2005 filed Apr. 29, 2005, the disclosure of which is hereby incorporated by reference.

BACKGROUND OF THE INVENTION

1. Technical Field of the Invention

The present invention relates to an improved digital Delay/Phase Lock Loop (DLL/PLL) with a duty cycle locking mechanism. More specifically the present invention provides an apparatus for enabling duty cycle locking at the rising/falling edge of the clock.

2. Description of Related Art

A PLL or DLL is extensively used in large digital chips like a System on a Chip (SOC), microprocessors, memories, and the like, to cancel the on chip clock amplification and buffering delays, and to improve the I/O timing margins. A DLL is preferred over a PLL as the increasing clock speeds and increasing levels of complexity in digital circuits create a hostile operating environment for phase alignment circuits.

Analog DLLs have been employed in the past to perform synchronization. Such analog DLLs comprise a delay chain having a delay of its elements being varied by analog bias voltages supplied by a phase detector. In digital systems, such as memories, microprocessors and application specific integrated circuits, these types of DLLs introduce analog design complications in a mainly digital design and therefore are avoided.

To overcome the above-mentioned complications, digital DLLs were developed that use a digitally adjustable delay line. Digital information is used to either include or exclude a certain number of delay elements within a delay chain. Although digital DLLs have a much higher jitter than analog DLLs, their ease of implementation in the digital system makes them a preferred solution in most digital applications.

The block diagram for a conventional digital DLL is illustrated in FIG. 1. The DLL comprises a DLL/PLL 4 receiving at a first input the external clock. The output DLLOUT of the DLL/PLL 4 is connected to the input of a clock tree 5. The output of the clock tree 5 is fed back as signal FEEDCLK to a second input of the DLL/PLL 4. The problem with a conventional DLL 4 is that the input clock (EXTCLK) has to pass through long delay chains and other logic. Secondary effects on semiconductor delays and logic devices alter the shape of the input clock EXTCLK pulse and hence, the duty cycle of the output clock DLLOUT is not the same as that of input clock.

The problem of altered duty cycle in a DLL is illustrated with the help of the waveforms shown in FIG. 2. It can be observed that output of the prior art DLL, the signal DLL-OUT, has a different duty cycle when compared with the input external clock, signal EXTCLK, received by the DLL/PLL 4. Similarly, in case of phase and frequency locking PLLs, the duty cycle is dependent on the VCO clock. So it is impossible to get the same duty cycle of the output clock as that of the input clock.

This change in duty cycle may not be a problem in chips operating on only one clock edge (either the falling or rising edge) as the period of the clock remains unaltered and hence one of the PLL/DLL output clock edges can be synchronized with the input external clock edge for the chip operation. However, this is a critical problem in high performance digital chips, which perform operations on both the falling and rising clock edge. As both edges cannot be synchronized due to alteration in duty cycle, the chip may produce erroneous output because the devices using the external clock (such as I/O ports and the like) may perform an operation before/after an operation is performed on a device using the internal clock (such as logic blocks, memory and the like). For example, in high performance DDR memories, where read and write operations occur at both rising edge and falling edge of the clock having some duty cycle (other than that of 50%), an external clock may result in new input being sampled by the I/O port before the memory is able to write the previous data in a memory location. Thus it is necessary to preserve the duty cycle of the input clock since an altered duty cycle of the input clock may result in erroneous operation in cases where both clock edges are used for chip operations.

United States Patent Application publication number 2003/0218486 describes a digital DLL for correcting the duty cycle. The digital DLL apparatus for correcting a duty cycle includes: a buffer for producing a clock input signal; a delay line unit for receiving/delaying the clock input signal and outputting the clock input signal; a blend circuit for bypassing the first clock signal or producing a blended clock signal; a delay model unit for compensating a time difference of an external clock and an internal clock and generating a compensate clock signal; a direct phase detector for generating a first comparison signal; and a phase detector for generating a second comparison signal. The disclosed apparatus corrects the duty error by using the blend circuit and generates an internal clock signal having 50% of the duty cycle.

The main problem with the conventional DLL arises when the duty cycle of the input clock is not 50% as the DLL is unable to set the duty cycle of the output clock other than at 50%. Although proper sizing of the delay chain and other logic blocks in the clock path can preserve the duty cycle, the process variations would cause a disturbance in the duty cycle. Furthermore, the sizing of the same may have to be varied for different processes. This acts as a limitation to the use of DLL/PLL.

Hence, there is a need for DLLs/PLLs that provide duty cycle locking for input clocks having duty cycle other than 50%. Additionally, there is also a need for a DLLs/PLLs whose duty cycle is process independent.

SUMMARY OF THE INVENTION

To address the foregoing drawbacks of the prior art, the present invention provides a digital DLLs/PLLs with a duty cycle locking mechanism for input clocks with varying duty cycles.

Additionally, the instant invention provides for a process independent DLLs/PLLs whose duty cycle does not change with the semiconductor technology process.

In an embodiment of the invention, an apparatus for enabling duty cycle locking at the rising/falling edge of the clock comprises a delay locked loop for clock synchronization, an edge locking block connected to said delay locked loop for locking the duty cycle at the edge of the clock, and a clocktree delay connected to said edge locking block being fed back to said delay locked loop.

The edge locking block comprises a counter receiving a gated input clock, a lock detector receiving an input clock for generating control signals, an address decoder connected to said counter for generating set of selection signals, a first multiplexer having its select lines connected to said selection signals, plurality of delay chains providing multiple output taps with first delay chain connected to said first multiplexer, a second multiplexer connected to one of said plurality of delay chains with its select lines being hard wired, and a latch connected to the output of said first multiplexer and said second multiplexer for providing the output.

In an implementation, the middle tap of the second delay chain is selected.

In an implementation, a logic gate is connected to the output of said first multiplexer for negative edge locking.

In an implementation, said logic gate is an inverter.

In an implementation, the output of said apparatus is fed back to said DLL/PLL through a clocktree delay.

In accordance with another embodiment, a method for enabling duty cycle locking at the rising/falling edge comprises the steps of: synchronizing the external clock with the internal clock, adjusting the unsynchronized edge of the external clock with the corresponding internal clock edge for duty cycle locking, and feeding back the adjusted clock until duty cycle locking.

The duty cycle locking step comprises the steps of generating control signals for duty cycle locking, counting the clock cycles of gated input clock based on said control signals, selecting a first delayed signal using first multiplexer depending upon the counter value, selecting a second delayed signal corresponding to the middle tap of the second delay chain, and setting the latch by said second delayed signal and resetting the latch by said first delayed signal.

In an embodiment, the present invention uses a Edge Locking block for duty cycle locking as the negative edge of the external clock is continuously compared with the negative edge of the DLL output. Appropriate changes are made to the duration of DLL output clock based on the comparison of the external clock and the DLL output. The DLL apparatus is process independent as duty cycle locking is achieved using duty cycle locking mechanism, which is independent of semiconductor technology used.

In accordance with an embodiment, an apparatus comprises a delay lock loop circuit having a first input for receiving an input clock signal, a second input for receiving a feedback clock signal and an output for outputting a first output clock signal whose duty cycle is different than the input clock signal. An edge locking circuit has a first input for receiving the input clock signal, a second input for receiving the first output clock signal, a third input for receiving the feedback clock signal and an output for outputting a second output clock signal whose duty cycle substantially matches the input clock signal. A clock tree delay circuit receives the second output clock signal and generates the feedback clock signal.

In accordance with an embodiment, a delay lock loop circuit receives an input clock signal having a non-50% duty cycle and outputs an output clock signal also having a non-50% duty cycle which matches the duty cycle of the input clock signal.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 5 shows the waveforms for the Lock Detector in accordance with the invention; and FIG. 6 shows the waveforms describing duty cycle locking process in accordance with the invention.

DETAILED DESCRIPTION OF THE DRAWINGS

The present invention relates to an improved DLL/PLL with a variable duty cycle locking mechanism. The instant invention is process independent and works for input clocks with duty cycles other than 50%. Due to the current trend of using digital DLLs in many applications, the embodiments of the invention are described in relation to a digital DLL. However, the same architecture may be applied with other types of DLLs or even PLLs.

Figure 1:
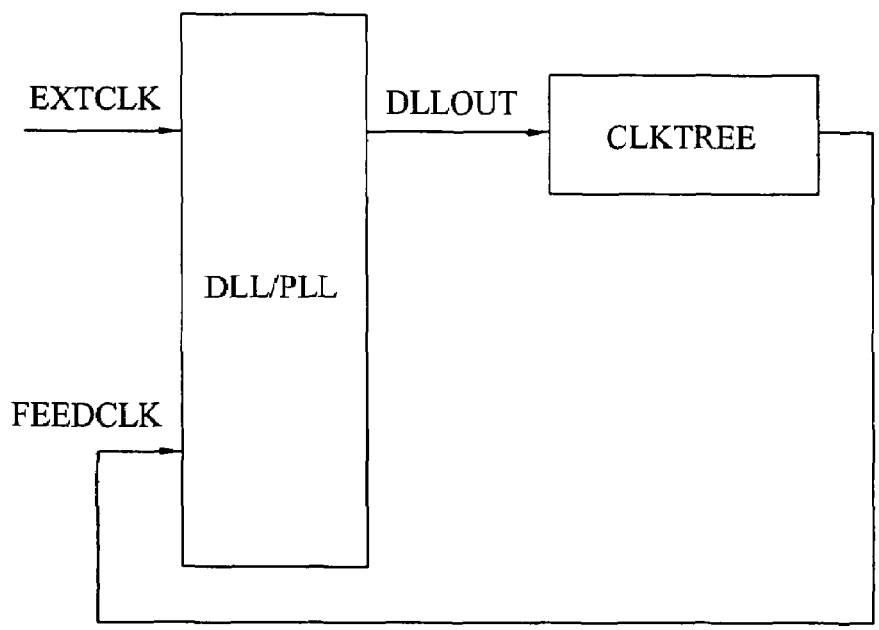
FIG. 1 shows the setup used in prior art DLLs.
Figure 2:
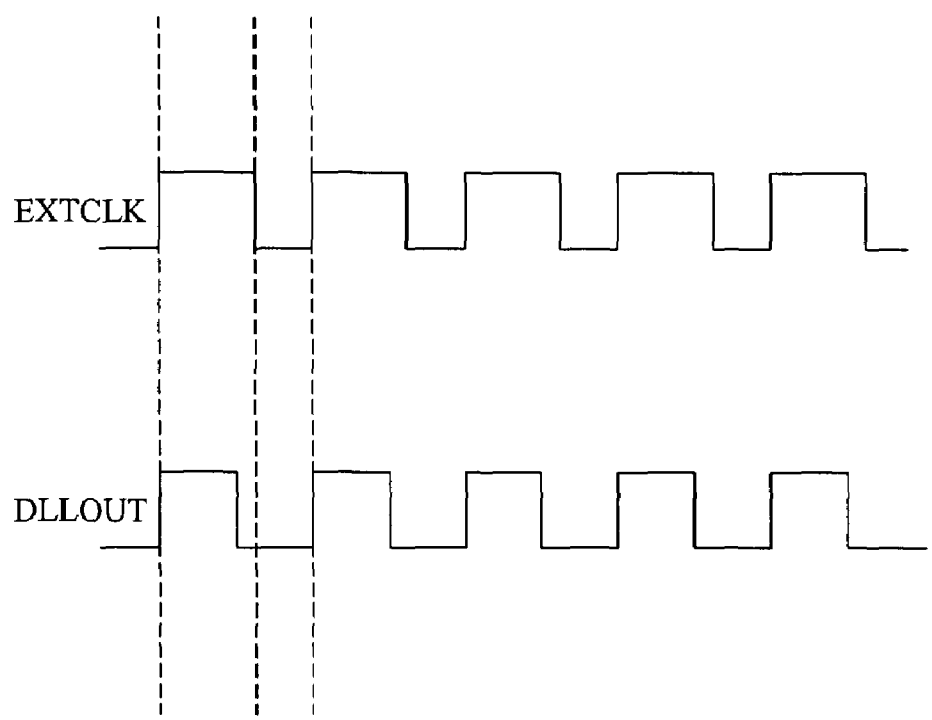
FIG. 2 illustrates the waveform of conventional DLLs.
Figure 3:
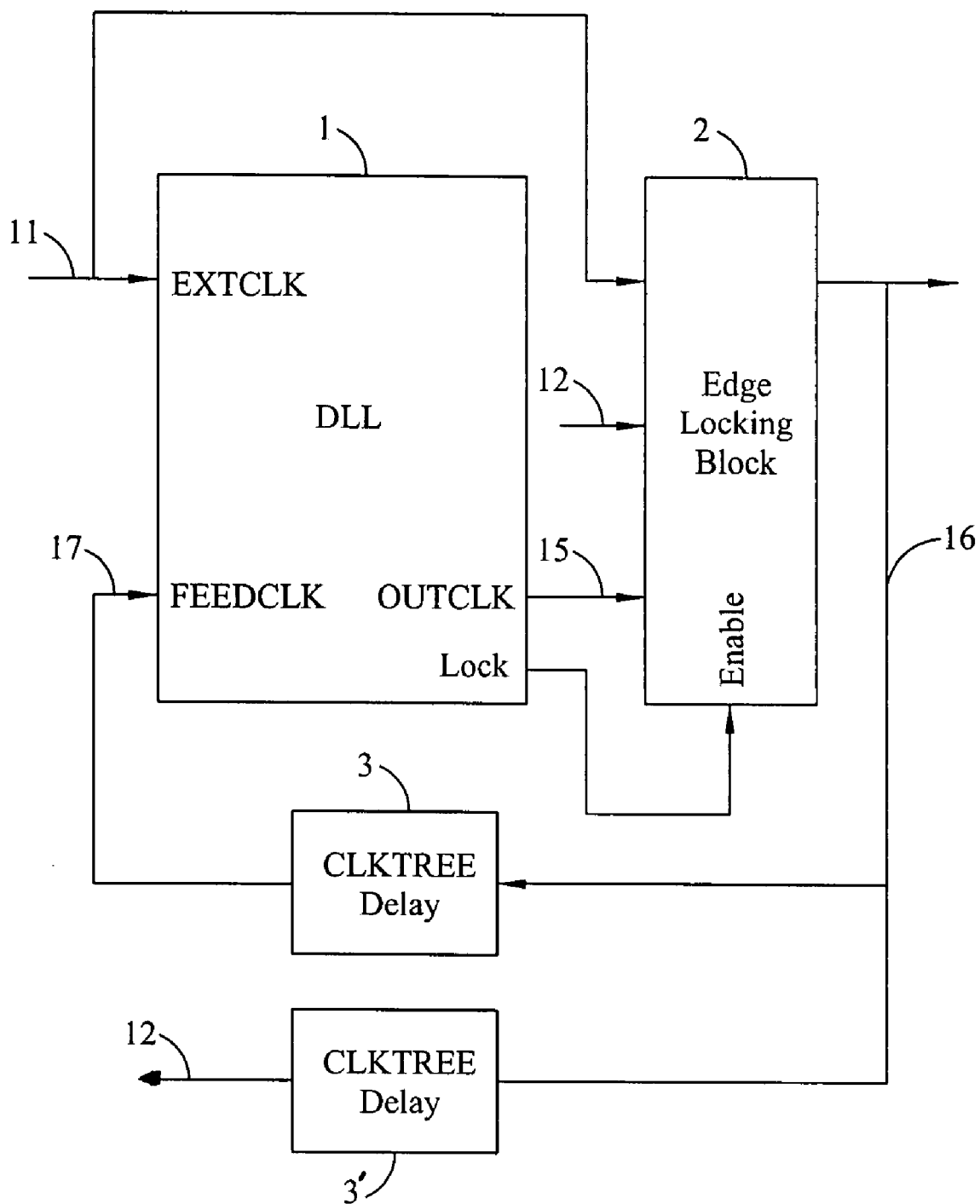
FIG. 3 shows the DLL setup for duty cycle locking in accordance with the invention.

FIG. 3 illustrates a block diagram for an embodiment of the instant invention. FIG. 3 discloses a conventional DLL/PLL block 1 connected to an Edge Locking block 2. A CLKTREE delay 3 is the internal delay of the DLL/PLL feedback path or the associated path and is similarly illustrated and uses the same reference number in the figure to communicate the same. When compared with FIG. 1, the modified architecture illustrated in FIG. 3 has an additional Edge Locking Block 3 in the feedback path for performing duty cycle locking. A modified structure of present invention may be used with a rising Edge Locking Block where the conventional DLL/PLL performs edge locking for the falling edge. The present invention covers all such embodiments of the modified DLL/PLL architecture.

The operation of Edge Locking Block 2 is initiated after the DLL/PLL 1 has performed the operation of edge detection and locking for one of the edges. At that point in time, the LOCK signal is generated by the DLL/PLL 1. Basically, the Edge Locking Block 2 is initiated when the LOCK signal generated by the DLL/PLL 1 goes logic high since the LOCK signal is received on the enable pin of the Edge Locking Block 2. After the Edge Locking Block 2 is enabled by the LOCK signal, the output clock OUTCLK 15 from the DLL 1, the external clock 11 and the fed back internal clock 12 are received by the Edge Locking Block 2. The duty cycle of the internal clock 12 with clock tree delay (provided by block 3'), which is the DLL/PLL output OUTCLK 15 on the feedback path, is increased or decreased based on a comparison of the non matching edges of the internal clock 12 and the external clock 11. In the present embodiment, the negative edges of the internal and external clock are compared and the duration of the high in the internal clock (duty cycle) is accordingly increased or decreased based on whether the falling edge of the internal clock is to the left or right of the external clock. The OUTCLK 15 is fed back to the DLL/PLL 1 through the Edge Locking Block 2 without any changes when the LOCK signal is low (i.e., when the block 2 is not enabled).

Figure 4:
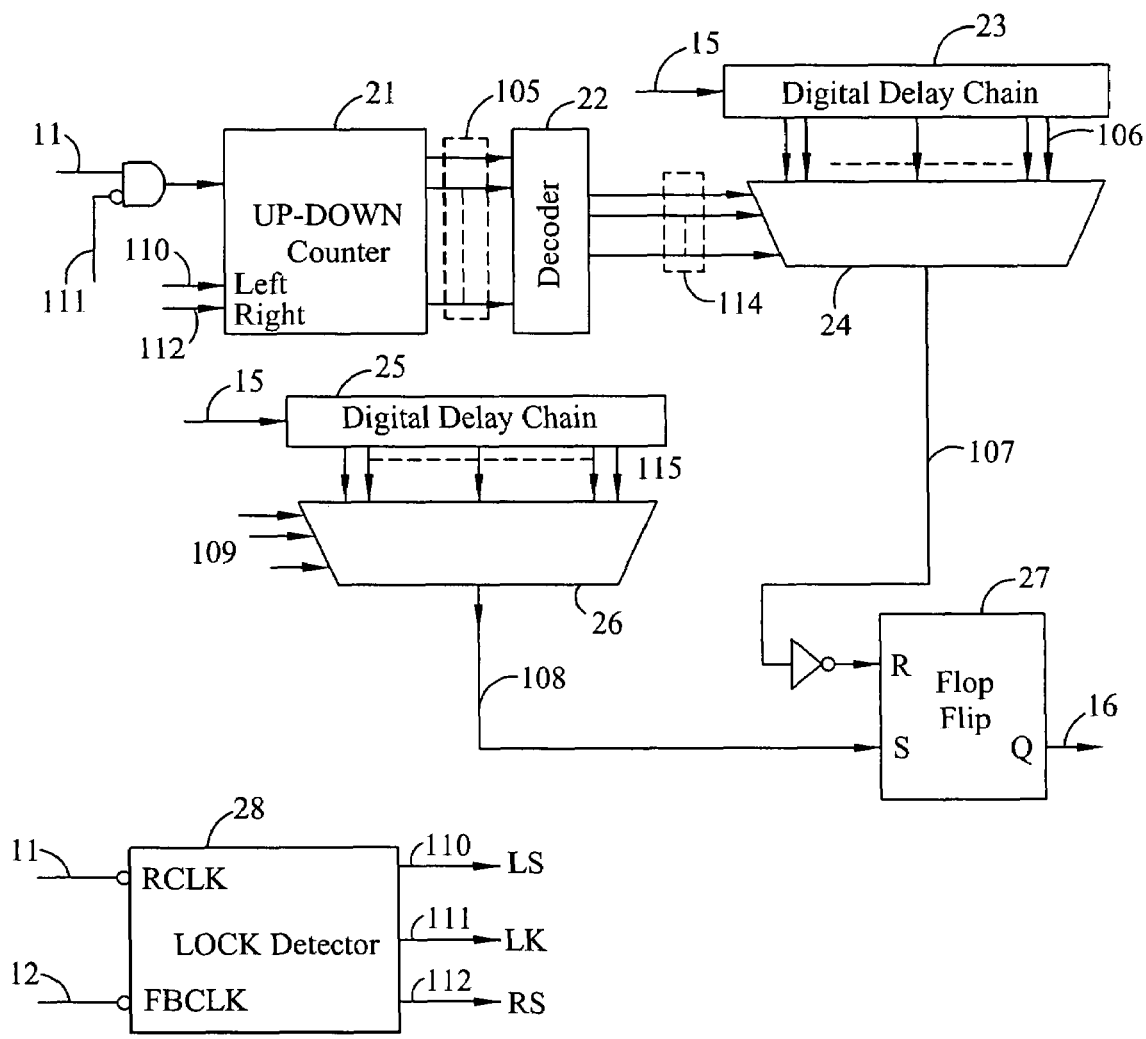
FIG. 4 shows the circuit diagram of Negative Edge Locking block for Duty cycle locking in accordance with the invention.

FIG. 4 illustrates a block diagram of the Edge Locking Block 2 which comprises a Lock Detector 28, and an up/down counter 21 whose output is connected to an address decoder 22, which in turn is connected to the select lines of a multiplexer 24. The digital delay chain 23 receives the clock output OUTCLK 15 of the DLL 1 and is connected to the multiplexer 24. A second digital delay chain 25 also receives the clock output OUTCLK 15 of the DLL 1 and is connected to the multiplexer 26. A Flip Flop 27 receives the output of multiplexers 24 and 26 at its reset and set inputs respectively.

The operation of the Edge Detection block 2 is dependent on three internally generated control signals, output by the lock detector 28, namely, LS 110 for left shift, LK 111 for Lock and RS 112 for right shift. The Lock Detector 28 is used for negative edge locking by using inverted internal clock signal 12 and inverted external clock signal 11 as inputs. The three control signals are generated based on the locking window around the negative edge of external clock 11. LS 110 signal is high only when the negative edge of internal clock 12 is to the right of the window and RS 112 signal is high only when the negative edge of internal clock 12 is to the left of the window. Similarly, the LK 111 signal is high only when the negative edge of the internal clock 12 is within the window. Hence only one of the three control signals is high at any stage of the operation. These control signals are used in other blocks for generating a modified output signal 16, which has the same duty cycle as the external clock 11.

The Edge Locking Block 2 also has an enabling logic, which receives the internal clock 12, inverted internal Lock control signal LK 111, and the LOCK signal from the DLL/PLL. At initialization, the middle tap of the identical delay chains 23 and 25 is selected using the multiplexers 24 and 26. The selection signal 109 for the multiplexer 26 is hard wired to select the middle tap permanently and generate a delayed version of signal 15 as signal 108. This is used to provide uniformity in secondary effects due to presence of delay chain 23 and multiplexer 24. Using a NAND gate, the counter 21 receives the clock signal 11 when LOCK signal 111 from DLL/PLL 1 is high and while the Lock condition is not achieved for negative edge locking. The counter 21 counts up or down based on the control signals RS 110 and LS 112 and generates a set of inputs 105 for the address decoder 22. The address decoder 22 generates a set of selection signals 114 for the multiplexer 24, which accordingly selects from amongst the delayed versions of the DLL output 15 to generate signal 107. Hence by delaying the DLL/PLL output 15 until negative edge locking is achieved, the signal 107 is attained whose negative edge matches with the negative edge of the external clock signal 11. The signal 108 is fed to the set pin of the flip-flop 27 and the inverted signal 107 is fed to the reset pin.

Since signal 108 is fed to the set pin of the flip flop 27, the output 16 goes high on the rising edge of the unmodified delayed version 108 of the DLL/PLL output 15. Hence its rising edge matches with that of the external clock signal 11. The signal 16 remains high until the inverted signal 107 used as a reset signal for the flip flop goes high. Hence the signal 16 is reset to low on the falling edge of signal 107. As mentioned above, the falling edge of signal 107 is matched with the falling edge of external clock 11 and hence, the output 16 is reset at the negative edge of the external clock 11. As a result, the duty cycle of the signal 16 is same as that of the external clock signal 11.

FIG. 5.1 shows the window formed around the falling edge of clock FBCLK signal 12 as received by the lock detector 28. As shown in FIG. 5.2, when the falling edge of clock RCLK 11 is towards the right of the window, the Lock Detector generates logic high at LS and logic low at LK and RS. Similarly, as shown in FIG. 5.3, when the falling edge of RCLK 11 is towards the left of the window, the Lock Detector generates logic low at LS and LK and logic high at RS. As shown in FIG. 5.4, when the falling edge of RCLK 11 falls in line with window, the Lock Detector generates logic low at LS and RS and logic high at LK.

FIG. 6.1 illustrates the case when the output of clocktree signal 12 has less duty cycle as compared to the external clock 11. In this case, the falling edge of clocktree signal 12 is towards the left of the window around the falling edge of external clock 11. The Lock Detector 28 generates RS high and LS and LK low. At the rising edge of clock 11, the counter gets incremented. As a result, next TAP is selected by the multiplexer from the delay chain 23.

Similarly, FIG. 6.2 shows the case where the clocktree output signal 12 has higher duty cycle as compared to the external clock 11. The falling edge of signal 12 is towards the right of the window around the input clock 11. The Lock Detector 28 generates LS high and LK and RS low. Hence, at the rising edge of the clock 11, the counter gets decremented and a previous TAP is selected from the delay chain 23.

In FIG. 6.3, the falling edge of signal 12 is inside the window around clock 11. The Lock Detector generates LK high and LS and RS low. So the clock to the counter 21 is disabled and the counter keeps the current value.

Hence, the present invention provides a technique and for duty cycle locking where both rising and falling edges are locked to the external clock. Hence there is no duty cycle distortion in the instant invention. The technique is fully digital and process independent as same duty cycle locking mechanism can be used in different semiconductor technologies.

A simulation of the present invention at 90 nm process at slowest corner and highest frequency (400 MHz) shows that if we use the DLL without using the duty cycle technique, then the duty cycle variation is 700 ps to 900 ps (excluding the duty cycle disturbance in Clock tree). Whereas if we use the duty cycle locking technique and use 60 ps locking window, then the maximum duty cycle disturbance will be the size of the window i.e. 60 ps.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. Apparatus for enabling duty cycle locking at the rising/falling edge of the clock, comprising:
 a delay locked loop for clock synchronization;
 an edge locking block connected at a first input to a clock output of said delay locked loop for locking the duty cycle at the edge of the clock; and
 a clocktree delay connected to feed back an output of said edge locking block to an input of said delay locked loop and further to feed back the output of said edge locking block to a second input of the edge locking block.

2. Apparatus for enabling duty cycle locking at the rising/falling edge of the clock, comprising:
 a delay locked loop for clock synchronization;
 an edge locking block connected to a clock output of said delay locked loop for locking the duty cycle at the edge of the clock; and
 a clocktree delay connected to feed back an output of said edge locking block to an input of said delay locked loop;
 wherein said edge locking block comprises:
  a counter receiving a gated input clock;
  a lock detector receiving an input clock for generating control signals;
  an address decoder connected to said counter for generating a set of selection signals;
  a first multiplexer having its select lines connected to said selection signals;
  a plurality of delay chains providing multiple output taps with a first delay chain connected to said first multiplexer;
  a second multiplexer connected to a second one of said plurality of delay chains with its select lines being hard wired; and
  a latch connected to the output of said first multiplexer and said second multiplexer for providing the output of said edge locking block.

3. The apparatus as in claim 2 wherein a middle tap of the second delay chain is selected.

4. The apparatus as in claim 2 wherein a logic gate is connected to an output of said first multiplexer for negative edge locking.

5. The apparatus as in claim 4, wherein said logic gate is an inverter.

6. A method for enabling duty cycle locking at the rising/falling edge comprising the steps of:
 synchronizing an external clock with an internal clock using delay lock loop processing;
  adjusting an unsynchronized edge of the external clock with a corresponding internal clock edge for duty cycle locking using edge lock processing to generate an adjusted clock; and
  feeding back the adjusted clock to both the delay lock loop processing and edge lock processing until duty cycle locking is achieved.

7. A method for enabling duty cycle locking at the rising/falling edge comprising the steps of:
 synchronizing an external clock with an internal clock;
 adjusting an unsynchronized edge of the external clock with a corresponding internal clock edge for duty cycle locking to generate an adjusted clock;
 feeding back the adjusted clock until duty cycle locking is achieved;
 generating control signals for duty cycle locking;
 counting clock cycles of a gated input clock based on said control signals;
 selecting a first delayed signal depending upon the count;
 selecting a second delayed signal; and
 setting a latch by said second delayed signal and resetting the latch by said first delayed signal.

8. Apparatus, comprising:
 a delay lock loop circuit having a first input for receiving an input clock signal, a second input for receiving a first feedback clock signal and an output for outputting a first output clock signal whose duty cycle is different than the input clock signal;
 an edge locking circuit having a first input for receiving the input clock signal, a second input for receiving the first output clock signal, a third input for receiving a second feedback clock signal and an output for outputting a second output clock signal whose duty cycle substantially matches the input clock signal; and
 a clock tree delay circuit receiving the second output clock signal and generating the first and second feedback clock signals.

9. The apparatus of claim 8 wherein the edge locking circuit operates to compare non-matching edges of the received input clock signal and feedback clock signal, and modify a duty cycle of the second output clock signal based on that comparison.

10. The apparatus of claim 9 wherein the edge locking circuit compares non-matching falling edges of the received input clock signal and feedback clock signal and increases/decreases the duty cycle of the second output clock signal based on that comparison.

11. The apparatus of claim 9 wherein the edge locking circuit operates to set a rising edge of the second output signal to match a rising edge of the first output clock signal and set a falling edge of the second output signal to match a falling edge of a time shifted version of the first output clock signal.

12. The apparatus of claim 11 wherein the edge locking circuit determines an amount of time shifting with respect to the falling edge of the first output clock signal based on the comparison of the non-matching edges of the received input clock signal and feedback clock signal.

13. A method, comprising:
 delay lock loop processing an input clock signal and a feedback clock signal to output a first output clock signal whose duty cycle is different than the input clock signal;
 edge locking a second output clock signal whose duty cycle substantially matches the input clock signal in response to the input clock signal, the first output clock signal and the feedback clock signal; and
 delaying the second output clock signal to generate the feedback clock signal.

14. The method of claim 13 wherein edge locking comprises comparing non-matching edges of the received input clock signal and feedback clock signal, and modifying a duty cycle of the second output clock signal based on that comparison.

15. The method of claim 13 wherein comparing comprises comparing non-matching falling edges of the received input clock signal and feedback clock signal and increasing/decreasing the duty cycle of the second output clock signal based on that comparison.

16. The method of claim 13 wherein edge locking comprises setting a rising edge of the second output signal to match a rising edge of the first output clock signal and setting a falling edge of the second output signal to match a falling edge of a time shifted version of the first output clock signal.

17. The method of claim 16 further comprising determining an amount of time shifting with respect to the falling edge of the first output clock signal based on the comparison of the non-matching edges of the received input clock signal and feedback clock signal.

18. A delay lock loop circuit, comprising circuitry which receives an input clock signal having a non-50% duty cycle and outputs an output clock signal also having a non-50% duty cycle which matches the duty cycle of the input clock signal;

wherein the circuitry comprises:
a delay circuit that delays the output clock signal to produce a feedback clock signal;
a delay lock loop that receives input clock signal and generates a locked clock signal having a duty cycle that does not match the non-50% duty cycle of the input clock signal; and
an edge locking circuit which outputs the output clock signal with matching duty cycle, the edge locking circuit operating to set a first edge of the output clock signal to match a corresponding first edge of the locked clock signal and set a second edge of the output clock signal to match a corresponding time shifted second edge of the locked clock signal, wherein an amount of time shifting is determined by the edge locking circuit based on an edge comparison of the input clock signal and the feedback clock signal.

19. A delay lock loop circuit comprising circuitry which receives an input clock signal having a non-50% duty cycle and outputs an output clock signal also having a non-50% duty cycle which matches the duty cycle of the input clock signal;

wherein the circuitry comprises:
an edge locking circuit which outputs the output clock signal with matching duty cycle, the edge locking circuit operating to set a first edge of the output clock signal to match a corresponding first edge of the input clock signal and set a second edge of the output signal to match a corresponding time shifted second edge of a locked version of the input clock signal,
wherein an amount of time shifting is determined by the edge locking circuit based on an edge comparison of the input clock signal and a time delayed version of the output clock signal.

\* \* \* \* \*